United States Patent [19]

Adair et al.

[11] Patent Number: 4,910,118

[45] Date of Patent: Mar. 20, 1990

[54] METHOD AND PHOTOSENSITIVE MATERIAL FOR FORMING METAL PATTERNS EMPLOYING MICROCAPSULES

[75] Inventors: Paul C. Adair, Springboro; Katherine A. Gyure, Miamisburg; James A. Dowler, Franklin, all of Ohio

[73] Assignee: The Mead Corporation, Dayton, Ohio

[21] Appl. No.: 266,215

[22] Filed: Oct. 28, 1988

Related U.S. Application Data

[62] Division of Ser. No. 32,403, Mar. 30, 1987, abandoned.

[51] Int. Cl.$^4$ ............................ G03C 5/54; G03F 7/00
[52] U.S. Cl. ..................................... 430/138; 430/202; 430/253; 430/311
[58] Field of Search ............... 430/138, 202, 253, 311; 427/98, 99, 89, 304, 305

[56] References Cited

U.S. PATENT DOCUMENTS

| | | | |
|---|---|---|---|
| 3,758,304 | 9/1973 | Janssen et al. | 430/311 |
| 3,904,783 | 9/1975 | Nara et al. | 427/54 |
| 3,950,570 | 4/1976 | Kenny | 427/98 |
| 4,084,023 | 4/1978 | Dafter | 427/98 |
| 4,239,813 | 12/1980 | Murakami et al. | 427/98 |
| 4,399,209 | 8/1983 | Sanders et al. | 430/138 |
| 4,440,846 | 4/1984 | Sanders et al. | 430/138 |
| 4,451,505 | 5/1984 | Jans | 427/98 |
| 4,487,811 | 12/1984 | Eichelberger et al. | 427/98 |
| 4,554,235 | 11/1985 | Adair et al. | 430/138 |
| 4,608,330 | 8/1986 | Marabella et al. | 430/138 |
| 4,687,725 | 8/1987 | Wright et al. | 430/138 |
| 4,701,397 | 10/1987 | Rourcke et al. | 430/138 |

*Primary Examiner*—Richard L. Schilling
*Attorney, Agent, or Firm*—Thompson, Hine and Flory

[57] ABSTRACT

Processes for forming metal patterns such as electric circuits and photosensitive materials useful therein are disclosed wherein a layer of photosensitive microcapsules is used to form a pattern of an adhesive, a metallic pigment, a metal salt or a reducing agent by exposing the layer of microcapsules to actinic radiation and transferring the internal phase to a support member. A pattern of the pigment salt or reducing agent is thereby formed on the support member which is treated with an electroless plating solution to form the metal pattern.

13 Claims, 2 Drawing Sheets

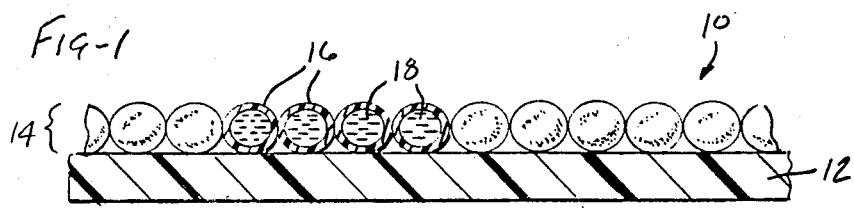
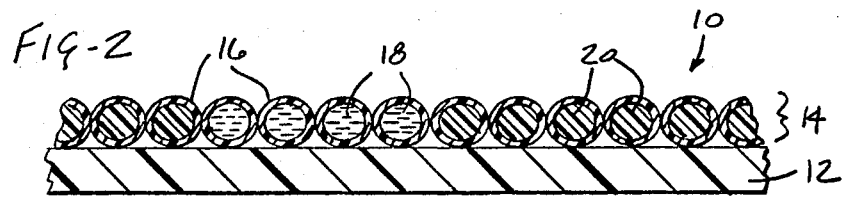
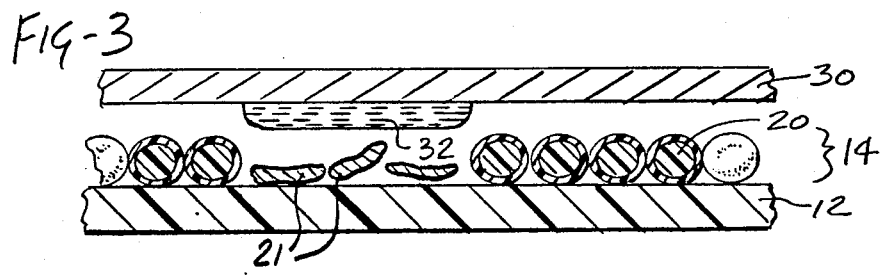
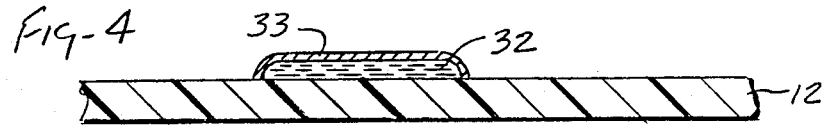
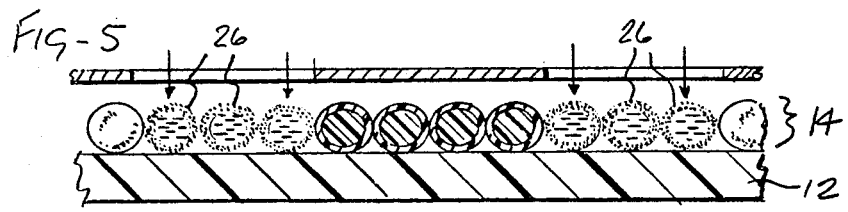

METHOD AND PHOTOSENSITIVE MATERIAL FOR FORMING METAL PATTERNS EMPLOYING MICROCAPSULES

This is a divisional application of co-pending application Ser. No. 032,403, filed Mar. 30, 1987, now abandoned.

BACKGROUND OF THE INVENTION

The present invention relates to a photographic method for forming a metal pattern on a substrate and to a photosensitive material useful therein. While the invention encompasses the formation of metal patterns for any purpose including decorative purposes, it particularly relates to the formation of electric circuits.

Commonly assigned U.S. Pat. Nos. 4,399,209 and 4,440,846 disclose an imaging system which utilizes microcapsules containing a photosensitive composition and a color precursor to form images by controlling the release of the color precursor from the microcapsules. In accordance with one embodiment of the present invention, this technology is adopted to form metal patterns and, more particularly, printed circuits.

Various methods for manufacturing printed circuits are known in the art. These methods include so-called additive, semi-additive and subtractive processes. There has been significant interest in the additive process which involves forming a pattern of a material which functions as a catalyst or nucleation site onto which the metal pattern is deposited from an electroless plating solution. Both photographic and printing techniques have been used to form these catalytic patterns. For example, inks based on resins (e.g., epoxy and polyimide resins) containing iron or nickel metal powders have been silk screened on insulative substrates and immersed in copper sulfate solutions to form copper patterns (C&E News, July 2, 1984, p.5).

U.S. Pat. No. 3,950,570 to Western Electric discloses a process in which an insulative member is coated with a photosensitive sensitizer (a colloid of a sensitizing species of Ni, Mn, U, Mo or W). By exposing the sensitizer, it is either activated or inactivated in terms of its ability to reduce an activating metal ion such as silver, palladium or platinum ion. By exposing the sensitizer in a pattern conforming to the electrical circuit and treating with a solution of the activating metal ion and then with an electroless plating solution which is catalyzed by the reduced silver, palladium or platinum, a circuit is formed. Related methods are described in U.S. Pat. Nos. 4,084,023 and 3,904,783.

SUMMARY OF THE INVENTION

Broadly, the present invention relates to the use of photosensitive microcapsules in the manufacture of metal patterns such as electric circuits or decorative patterns.

In accordance with one embodiment of the present invention a seed pattern is formed by transfer from a pattern-wise exposed layer of photosensitive microcapsules containing the seed material in the internal phase. The release of the seed material from the microcapsules is controlled by exposure. This is described in detail in U.S. Pat. No. 4,399,209. Once a pattern of the seed material is formed by the above process, the metal pattern can be formed by processes which are known in the art. The seed pattern can be a pattern of a metal, a metal salt, or a reducing agent.

In the embodiment of the invention where the seed material is a metal salt, a substrate containing an image-wise pattern of such a metal salt is introduced to a plating bath containing a second metal salt and a reducing agent. The seed metal salt is at such a concentration and of such a standard potential that the seed salt is reduced much more rapidly by the reducing agent than is the second metal salt in the bath. Once the seed metal salt is reduced, these particles function as nucleation sites or as catalysts for the reduction of the second, less active, metal salt. A metal pattern is thereby formed.

In the embodiment of the invention where the seed material is a reducing agent, a substrate containing an image-wise pattern of such a reducing agent is introduced to a plating bath containing a second reducing agent and a metal salt. The seed reducing agent is at such a concentration and of such a standard potential that the metal salt of the bath is reduced much more readily by the seed reducing agent than by the second reducing agent of the bath. A metallic seed pattern is thereby produced, these particles function as nucleation sites or as catalysts for the further reduction of metal salt by the second reducing agent of the bath. A metal pattern is thereby built-up.

One manifestation of the present invention is a photosensitive material useful in forming metal patterns, said material comprising a support having a layer of photosensitive microcapsules on the surface thereof, said microcapsules containing an internal phase including a seed material for forming said metal pattern.

Another manifestation of the invention is a process for preparing a metal pattern which comprises pattern-wise exposing to actinic radiation a photosensitive material comprising a support having a layer of photosensitive microcapsules on the surface thereof, said microcapsules containing an internal phase including a seed material for forming said metal patterns, assemblying said pattern-wise exposed photosensitive material with a support member upon which it is desired to form said metal patterns, subjecting said microcapsules to a uniform transfer force such that said seed material is pattern-wise transferred to the surface of said support member, contacting said surface of said support member to which said seed material is pattern-wise transferred with a metal plating solution under such conditions that a metal is deposited on said support member in said pattern.

Another manifestation of the present invention is a process in which the microcapsules are used to deposit a pattern of an adhesive. The adhesive can consist of unpolymerized photohardenable composition. The adhesive pattern is toned or dusted with a metal pigment which selectively adheres to it. The toned pattern is then used to form a metal pattern by electroless deposition.

BRIEF DESCRIPTION OF THE FIGURES

FIG. 1 is a cross-section of a photosensitive material in accordance with the present invention useful in forming metal patterns.

FIG. 2 is a cross-section of the material of FIG. 1 following exposure.

FIG. 3 illustrates transfer of the seed material to the support on which the metal pattern is formed.

FIG. 4 illustrates deposition of the metal pattern.

FIG. 5 is a cross-section of a photosensitive material employing microcapsules having photodegradable walls.

DETAILED DESCRIPTION OF THE INVENTION

Figure 6:
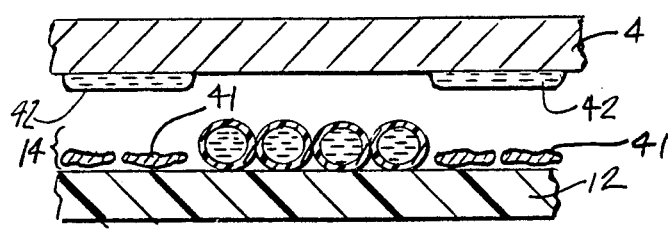
FIG. 6 illustrates transfer of internal phase using the material of FIG. 5.

FIG. 1 illustrates a photosensitive material 10 in accordance with the invention wherein a support member 12 is overcoated with a layer 14 of microcapsules. Microcapsules 14 include an encapsulating wall member 16 and an internal phase 18 containing a seed material. In accordance with one embodiment of the invention, internal phase 18 also contains a photosensitive composition which is capable of controlling the release of the seed material from the microcapsules after exposure. Photosensitive materials in accordance with this embodiment of the invention are analogous to the materials described in commonly assigned U.S. Pat. Nos. 4,399,209 and 4,440,846, however, a seed material and not a color former is included in the microcapsules.

FIG. 2 illustrates the photosensitive material of FIG. 1 after pattern-wise exposure which may be conducted using a photomask, a laser or pencil light beam, a CRT tube, a liquid crystal display, or in another known manner. For the illustrated embodiment alone, the internal phase is shown as one containing a photohardenable composition. During exposure, the internal phase is pattern-wise hardened. In the exposed areas the internal phase 20 is shown as being a solid resin, in fact it may be a semisolid or a highly viscous liquid. Solidification or thickening occurs as a result of polymerization or crosslinking of the internal phase initiated by exposure. The unexposed areas are not altered, the initial liquid phase 18 is retained.

Following exposure transfer is effected to a support member 30 as shown in FIG. 3. Transferred internal phase 32 containing the seed material is only present on support 30 in those areas corresponding to the unexposed areas shown in FIG. 2 in which the microcapsules 21 are ruptured. Transfer is typically achieved by assembling the photosensitive material 10 with support 30 and subjecting the assembly to a uniform rupturing and transfer force, most typically pressure. Other rupturing and transfer means are described in related commonly assigned patents.

A metal pattern 33 can be built upon the pattern 32 as shown in FIG. 4 by immersing in a plating solution. In one method, the seed material is an iron oxide. Pattern 32 containing the iron oxide can be plated with copper by immersion of the support in a conventional copper electroless plating bath. A problem has been encountered in forming copper patterns using commercially available copper plating solutions. These solutions have been slow and the seed pattern has been removed during the prolonged exposure to the solution which has been required to deposit a copper pattern. This problem may be overcome by designing more active copper plating solutions. The problem is not observed in forming silver patterns with silver plating solutions which are much faster. One solution to the problem of forming copper patterns has been designed. The support member is first placed in a silver plating solution and then in the copper solution. Once the silver is plated, adhesion of the seed pattern is not a problem and the support can be retained in the copper plating solution for the entire time required to deposit a copper pattern.

In another embodiment of the invention, the walls of the microcapsules are photosensitive—not the internal phase. For example, the wall contains a photosensitive material which is crosslinked by exposure to actinic radiation. Photosensitive microcapsules of this nature are known in the art and are described in Japanese Patent Publication No. 74-6212. Microcapsules are also known in which a diazonium compound is present in the microcapsule wall which breaks down on exposure. See Japanese Patent Publication 69-17733.

The operation of the latter material is illustrated in FIGS. 5 and 6. Prior to exposure, the physical structure of the material is identical to FIG. 4. However, as shown in FIG. 5, exposure alters the wall 16 of the microcapsules 14. Exposure results in a decomposed or structurally weaker wall member 26. The unexposed wall is not affected. The internal phase is not photosensitive and hence exposure does not harden the internal phase as in FIG. 2. This material is negative working whereas the material illustrated in FIGS. 1-4 is positive working. The microcapsule wall material 16 is selected such that in the unexposed areas it retains the internal phase under the force (e.g., pressure) required to rupture the exposed microcapsules having the exposure weakened wall 26. Thus when the photosensitive material shown in FIG. 5 is assembled with support member 4 as shown in FIG. 6 and subjected to a uniform transfer force, the transferred internal phase 42 is present in areas corresponding to the exposed areas in which microcapsules 41 are ruptured. Theoretically, these capsules could be ruptured by exposure alone and the force required would only be the force required to transfer the internal phase.

Those skilled in the art of forming metal patterns by electroless deposition will appreciate that a variety of materials can be used as seed materials for the deposition of metal patterns in accordance with the present invention.

One example of a seed material useful in the present invention is a metallic pigment. Typical pigments are iron, nickel, copper, zinc, palladium, tin and silver pigments. Included within this class are metal oxides such as the iron oxides $Fe_2O_3$ and $Fe_3O_4$. The pigment should have a very fine particle size. Usually pigments ranging from about 100 to 325 mesh are used.

The mechanism whereby metallic pigments catalyze electroless deposition is not clear. The metallic pigments used in the present invention may function as nucleation sites for metal deposited from the electroless bath. Alternatively, they may be displaced by the plating metal in a redox reaction. It is also possible that they catalyze deposition by facilitating electron transfer as a conducting means between the metal salt and reducing agent. The pigments are typically dispersed in the internal phase in an amount of about 5 to 25 parts by weight per 100 parts by weight of the balance of the internal phase constituents. Where the internal phase of the microcapsules is photosensitive, the remaining constituents usually consist of the photohardenable or photosoftenable composition. Where the wall of the microcapsule is photosensitive the internal phase usually consists of an oil (e.g., any of the oils conventionally used with color formers in the carbonless paper art may be used) and the seed material.

Figure 7:
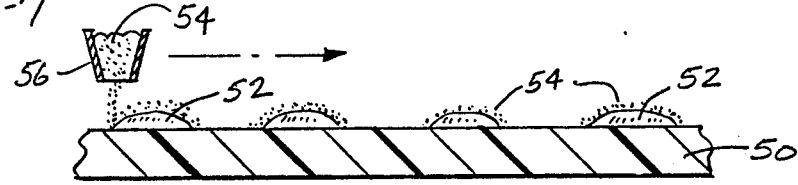
FIGS. 7 and 8 illustrate a toner process in accordance with the invention.
Figure 8:
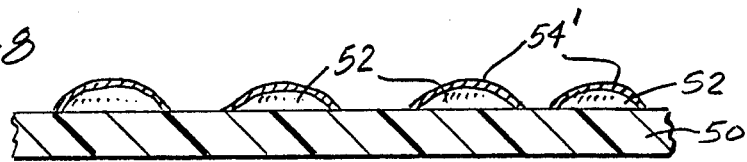

In accordance with one modification of the present invention, the microcapsules do not contain a seed material. Unhardened photosensitive composition or an adhesive is transferred from the microcapsules. This pattern of uncured photosensitive composition or adhesive is then toned with a metallic pigment. This is shown in FIG. 7 where an insulative support member 50 carries an adhesive pattern 52 formed as in FIGS. 3 or 6. A metal pigment 54 is applied to the pattern from dispenser 56 and selectively adheres to the adhesive areas 52. Support 50 is placed in a plating bath to form the metal pattern 54' as shown in FIG. 8. While the pigment is most typically a metallic pigment theoretically other seed materials disclosed herein could be selectively adhered to the support member in this manner.

Another seed material is a metal ion reducing agent. Reducing agents used in the photographic art to develop silver halide and/or other metal salts may be used. Examples of potentially useful reducing agents include hydroquinones, formaldehyde, phenidone, bisphenol, ascorbic or oxalic acid, reductones, aminophenols, diaminobenzenes, 3-pyrazidones, polyhydroxybenzenes, etc. When the internal phase includes a photosensitive composition, reducing agents must be selected which do not interfere with exposure and development of the composition. For example, some reducing agents are free radical traps and may inhibit free radical polymerizable compositions.

The reducing agent is usually used in an amount of about 5 to 30 parts per 100 parts of the balance of the internal phase constituents. The amount is adjusted based on the transfer characteristics so as to achieve adequate activity with respect to the processing solutions. In the embodiment of the invention where the seed material is a reducing agent, a substrate containing an image-wise pattern of such a reducing agent is introduced to a plating bath containing a second reducing agent and a metal salt. The seed reducing agent is at such a concentration and of such a standard potential that the metal salt of the bath is reduced much more readily by the seed reducing agent than by the second reducing agent of the bath.

Metal salts are another type of seed material useful in the present invention. In accordance with the most typical embodiments of the invention, these metal salts are organo-soluble, i.e., they are soluble in oily materials such as the photohardenable or photosoftenable compositions or in the oily solvents such as bisphenyls, deodorized kerosene, aliphatic hydrocarbons and other oils conventionally used in the internal phase of carbonless systems. So as not to remove the salts during the plating operation it is desirable to select salts with low water solubility as well.

The salts useful in the present invention are salts of metal ions selected from silver, nickel, platinum, tin, palladium, iridium, rhodium, osmium, ruthenium. Organosoluble salts include alkanoates, such as behenates, laurates, etc.

The metal salts are typically incorporated in the internal phase in an amount of about 5 to 30 parts per 100 parts of the other internal phase constituents. In the embodiment of the invention where the seed material is a metal salt, a substrate containing an image-wise pattern of such a metal salt is introduced to a plating bath containing a second metal salt and a reducing agent. The seed metal salt is at such a concentration and of such a standard potential that the seed salt is reduced much more rapidly by the reducing agent than is the second metal salt in the bath.

The seed materials are encapsulated by dissolving them or dispersing them (in the case of the metallic pigments) in the internal phase, dispersing the internal phase in a continuous phase, and forming the microcapsule wall in an otherwise known manner. Suitable encapsulation techniques are described in U.S. Pat. No. 4,399,209. The preferred microcapsule is a melamine-formaldehyde capsule.

Photohardenable compositions useful in the embodiment in which the internal phase is photosensitive are described in U.S. Pat. No. 4,399,209. Photosoftenable compositions are also disclosed in the patent. Other useful photosoftenable compositions employ polyaldehydes and are disclosed in U.S. Pat. Nos. 4,108,839; 3,984,253; and 3,915,704. Visible-light sensitive compositions employing anionic dye-counter ion compounds such as catonic dye borate complexes useful herein are described in U.S. application Ser. No. 944,305 filed Dec. 12, 1986. UV-sensitive compositions are described in detail in U.S. application Ser. No. 755,400 filed July 16, 1985.

The metal pattern is formed on a non-conductive support member to provide the printed circuit. Such support members are well known in the art. The support member may be treated or primed to enhance adhesion to the deposited pattern. It is believed that adhesion of the metal pattern is also a function of adhesion of the internal phase to the support. Specifically, the polar nature of the monomer used in many photohardenable compositions renders it susceptible to being washed off when the support is placed in the aqueous based electroless deposition baths conventionally used in the art. One response to this problem is to add a wax to the internal phase to make it more hydrophobic and thereby reduce its tendency to wash off during deposition processing. Where the internal phase includes a photohardenable composition adhesion may be improved by post-exposing the transferred pattern to actinic radiation.

After transfer of the pattern of the seed material, processing will vary depending on the nature of the seed material and the types of deposition baths used.

The activity of these plating baths can be varied in a known manner through controlling pH, salt, and/or reducing agent concentration.

The position of seed metals in the electromotive series does not appear to be critical to their use in the present invention. Reducing agents and metal salts, however, must be selected as described earlier.

In accordance with one embodiment of the invention, the metallic pigment is an iron oxide. This pigment can be used in conjunction with an electroless plating bath directly or indirectly to provide the metal pattern. In accordance with one embodiment of the invention, the non-conductive support carrying the metal pattern is immersed in a copper electroless plating bath to directly form a copper pattern. However, as previously indicated this process tends to be slow. The overall process can be made more efficient by first immersing the seed pattern of the metallic pigment in a silver electroless plating bath, which tends to be very fast, to form a pattern of silver metal which ultimately functions as a catalyst or nucleation site for deposition of a copper pattern from a copper electroless plating bath used subsequently.

Commericallly available electroless plating baths can be used in accordance with the present invention. Such baths are available from Shipley Company, Newton, Mass. Electroless plating baths are also described throughout the patent literature. See, for example, U.S. Pat. No. 4,152,477, Example 2; U.S. Pat. No. 4,239,813 (column 6); and U.S. Pat. No. 3,758,304 (Example IV).

The microcapsules used in the present invention preferably range from approximately 1 to 10 microns in size and, more preferably from about 3 to 8 microns.

The invention is illustrated in more detail by the following non-limiting examples.

EXAMPLE 1

The following procedure was used to prepare photosensitive materials in accordance with the invention.

A solution of 50 g TMPTA, 1.0 g isopropylthioxanthone, 2.0 g ethyl p-dimethylaminobenzoate, 10 g seed material and 3.33 g Desmodur N-100 (Mobay) was prepared as the internal phase and emulsified in a continuous phase of 180 g water, 4.0 g pectin, 3.5 g Versa TL 500 and 0.08 g sodium bicarbonate. A solution of 7.8 g melamine, 88 g water, and 13.0 g formaldehyde (37%) which had digested 30 minutes at 60° C. was added while agitating at 2000 rpm at 65° C. Agitation was continued 1 hour whereafter 15.4 g urea solution (50%) was added while agitating at 1200 RPM. Agitation was continued an additional 40 minutes.

Capsules prepared as above were coated on 3 mil polyester and allowed to dry.

EXAMPLE 2

Photosensitive materials were prepared as in Example 1 using the following seed materials:
A. Copper particles (1 micron)
B. Zinc particles (−325 mesh)
C. Tin particles (−325 mesh)
D Nickel particles (−325 mesh)
E. Iron oxide particles (−325 mesh)
F. t-butylhydroquinone
G. 2,7-Dihydroxynaphthalene
H. 1,6-Hydroxynaphthalene In each case (A–H) the material was exposed on a white light sensitometer through a mask. The exposed sheets were assembled with a printed circuit board support and the capsules were ruptured using laboratory press rollers.

The boards were immersed in a silver electroless plating bath containing 5.0 g $AgNO_3$ per 100 mls water and 0.2 g hydroquinone at room temperature. The boards were immersed 30 seconds while the bath was gently agitated. The boards were removed from the bath and a silver pattern was observed.

EXAMPLE 3

A silver-metal image was made as in Example 2 from capsules containing iron oxide. The substrate used was phenolic laminate NEMA grade G-10, MIL-P-18177 Type GEE (0.065 in) (Dayton Plastics). Upon drying, the board was placed into the following copper plating bath at 58° C. for 1.5 hours:

| | |
|---|---|
| 7.0 g | $CuSO_4$ |
| 10.75 g | Trisodium EDTA |
| 4.0 g | NaOH |
| 10.5 g | Formaldehyde |
| 1 g | Carbowax 4000 |
| 1000 g | Deionized water |

Upon removal from the plating bath, the board was allowed to dry. Testing with a multimeter showed the copper pattern to possess continuity.

EXAMPLE 4

Melamine-formaldehyde capsules were produced as in Example 1 containing the following internal phase:

| | |
|---|---|
| 35 g | TMPTA |
| 15 g | Octacosane |
| 1 g | Isopropylthioxanthone |
| 1 g | 2-Mercaptobenzoxazole |
| 2 g | N,N,2,4,6-pentamethylaniline |

These capsules were image-wise exposed and transferred to substrate boards under pressure. The resultant liquid patterns were toned with one of the following metallic powders:

| | |
|---|---|
| Copper | 1 micron (Alfa Products) |
| Tin | 325 mesh (Aldrich Chemical) |
| Black ferric oxide | 1 micron (Fisher) |
| Zinc | 325 mesh (Aldrich Chemical) |

After toning, the metal which had not adhered to unexposed areas was removed with Dust-Off ® (compressed Freon-12, a product of Fjeld Co., Inc). The four resultant boards were placed into the copper bath described in Example 3 for 1.5 hours at 58° C. Upon removal from the plating bath, the boards were washed with deionized water and allowed to dry. Each sample exhibited a copper pattern which possessed continuity.

Having described the invention in detail and by reference to preferred embodiments thereof, it will be apparent that modifications and variations are possible without departing from the scope of the invention defined in the appended claims.

What is claimed is:

1. A process for preparing a metal pattern which comprises pattern-wise exposing to actinic radiation a photosensitive material comprising a support having a layer of photosensitive microcapsules on the surface thereof, said microcapsules containing an internal phase including a seed material for forming said metal pattern, said microcapsules additionally including in their internal phase a photohardenable or photosoftenable composition or having walls made of a photohardenable or photosoftenable composition,
   assembling said pattern-wise exposed photosensitive material with a support member upon which it is desired to form said metal pattern,
   subjecting said microcapsules to a uniform rupturing and/or transfer force such that said seed material is pattern wise transferred to the surface of said support member, and
   contacting said surface of said support member to which said seed material is pattern-wise transferred with a metal plating solution under such conditions that a metal is deposited on said support member in said pattern.

2. The process of claim 1 wherein said photosensitive microcapsules include a photohardenable composition within the internal phase.

3. The process of claim 2 wherein said seed material is a metallic pigment and said plating solution is an electroless plating solution of a salt of a metal to be deposited and a reducing agent.

4. The process of claim 2 wherein said seed material is a reducing agent and said plating solution contains a salt of a metal to be deposited which is reducible by said reducing agent.

5. The process of claim 2 wherein said seed material is an organosoluble metal salt and said plating solution contains a reducing agent for said metal salt.

6. The process of claim 3 wherein said seed material is a metallic pigment and said plating solution is an electroless plating solution of a salt of a first metal to be deposited and a reducing agent and after said step of contacting said support member with said plating solution, said process includes the additional step of contacting said support member with a second plating solution of a salt of a second metal to be deposited and a reducing agent, said first metal being a metal which is more rapidly deposited than said second metal.

7. The process of claim 3 wherein said metallic pigment is a pigment of a metal selected from the group consisting of iron, copper, zinc, palladium, tin, iridium, rhodium, osmium, ruthenium, silver and oxides thereof.

8. The process of claim 7 wherein said plating solution is a solution of a salt of a metal selected from the group consisting of copper, silver, tin and palladium, said salt being a salt of a metal which is the same or different than the metal of said metallic pigment.

9. The process of claim 8 wherein said metallic pigment is an iron oxide and said metal salt is a silver salt.

10. The process of claim 8 wherein said metallic pigment is iron oxide and said metal salt is a copper salt.

11. The process of claim 3 wherein said metal pattern is electrically conductive and forms at least a portion of an electric circuit.

12. A process for preparing a metal pattern which comprises:

pattern-wise exposing to actinic radiation a photosensitive material comprising a support having a layer of photosensitive microcapsules on the surface thereof, said microcapsules containing an internal phase which includes a material for adhering a metallic pigment to a support member, said microcapsules including in their internal phase a photohardenable or photosoftenable composition or having walls made of a photohardenable or photosoftenable composition, assembling said pattern-wise exposed photosensitive material with a support member upon which it is desired to form said metal pattern, subjecting said microcapsules to a uniform rupturing and transfer force such that said material for adhering said pigment is pattern-wise transferred to the surface of said support, dusting the surface of said support member to which said adhesive material is pattern-wise transferred with a metallic pigment so as to adhere said metallic pigment to said adhesive material, and contacting said surface of said support member to which said adhesive material is pattern-wise transferred with a metal plating solution under such conditions that said metallic pigment serves as a catalyst or nucleation site for the electroless deposition of a metal pattern.

13. The process of claim 12 wherein said photosensitive microcapsules include in their internal phase a photohardenable composition or have walls made of a photohardenable composition and wherein said photohardenable composition also functions as said adhesive material for adhering said metallic pigment to said support member.

* * * * *